United States Patent [19]

Fredholm et al.

[11] Patent Number: 4,639,280

[45] Date of Patent: Jan. 27, 1987

[54] MONOCRYSTALLINE ALLOY WITH A NICKEL MATRIX BASIS

[75] Inventors: Allan Fredholm, Evry; James H. Davidson, Varennes-Vauzelles; Tasadduq Khan, Jouy-en-Josas; Jean-Mare C. F. Theret, Versailles, all of France

[73] Assignees: Association pour la et le Developpement des Methodes et Processus Industriels "A.R.M.I.N.E.S.", Paris; Societe Imphy S.A., Paris La Defense; Office National d'Etudes et de Recherche Aerospatiales (ONERA), Chatillon; Societe Nationale d'Etude et de Construction de Moteurs d'Aviation "S.N.E.C.M.A.", Paris, all of France

[21] Appl. No.: 679,766

[22] Filed: Dec. 10, 1984

[30] Foreign Application Priority Data

Dec. 29, 1983 [FR] France ................. 83 20986

[51] Int. Cl.$^4$ ............................................. C22C 19/05
[52] U.S. Cl. ................................... 148/404; 148/410; 148/162
[58] Field of Search ................. 148/404, 410, 162

[56] References Cited

U.S. PATENT DOCUMENTS 4,222,794 9/1980 Schweizer et al. .............. 148/3

FOREIGN PATENT DOCUMENTS 0063511 10/1982 European Pat. Off. .
2463192 2/1981 France .
2512837 3/1983 France .

Primary Examiner—R. Dean
Attorney, Agent, or Firm—Oblon, Fisher, Spivak, McClelland & Maier

[57] ABSTRACT

A monocrystalline alloy with a high resistance to creep having a nickel base matrix, with a density of the order of 8.5 and having a percentage, by weight, composition as follows: Co 5 to 8%—Cr 6.5 to 10%—Mo 0.5 to 2.5%—W 5 to 9%—Ta 6 to 9%—Al 4.5 to 5.8%—Ti 1 to 2%—Nb 0 to 1.5%—C, Zr, and B each less than 100 ppm—Ni remainder to 100%. Furthermore, the summation $Ta+Mo+\frac{1}{2}W$ lies between 11.5% and 13.5% by weight, the atomic sum $Ti+Al+Ta+Nb$ lies between 15.5% and 17%, the atomic sum $Ta+Nb+Mo+\frac{1}{2}W$ lies between 4% and 5.5%, the atomic sum $Ti+Al+Ta+Nb+Mo+\frac{1}{2}W$ lies between 17.5% and 19% and the atomic sum $Ti+Al$ lies between 12.8% and 14.5%.

14 Claims, 3 Drawing Figures

MONOCRYSTALLINE ALLOY WITH A NICKEL MATRIX BASIS

BACKGROUND OF THE INVENTION

1. Field of the Invention

The invention relates to monocrystalline alloys with a nickel basis, without the intentional addition of carbon, boron or zirconium.

2. Summary of the Prior Art

Over a period of several years, aeronautical applications of monocrystalline alloys for the manufacture of turbo-machine blades and vanes have been responsive to the need to bring into use families of alloys with particularly high performances, especially ensuring high creep resistance. The invention of FR-A 2 503 188, FR-A 2 512 837, FR-A 2 513 269 and EP-A 005291 are based on the work which has been carried out with this need in mind.

The object of the present invention is to provide a novel family of alloys of the kind referred to having a density of the order of 8.6 and having advantageous use characteristics, particularly in relation to creep resistance at high temperatures.

SUMMARY OF THE INVENTION

According to the present invention there is provided monocrystalline alloy with a nickel base matrix having a high creep resistance, having a density of the order of 8.6% and having the following composition:

| | | | |
|---|---|---|---|
| Co | 5 | to | 8% |
| Cr | 6.5 | to | 10% |
| Mo | 0.5 | to | 2.5% |
| W | 5 | to | 9% |
| Ta | 6 | to | 9% |
| Al | 4.5 | to | 5.8% |
| Ti | 1 | to | 2% |
| Nb | 0 | to | 1.5% |
| C,Zr,B | each less than 100 ppm | | |
| Ni | remainder to 100% | | | the percentages being given by weight, and the following criteria being observed:

the summation of the percentages by weight of Ta+Mo+½W lies between 11.5% and 13.5%;

the summation of Ti+Al+Ta+Nb in atomic percentages lies between 15.5 and 17%;

the summation of the atomic percentages of Ta+Nb+Mo+½W lies between 4 and 5.5%;

the summation of the atomic percentages Ti+Al+Ta+Nn+Mo+½W lies between 17.5 and 19%; and the summation of the atomic percentages Ti+Al lies between 12.8% and 14.5%.

Alloys in accordance with the invention have a structure composed essentially of two phases: the matrix $\gamma$ and a hardening phase $\gamma'$ (a composition of the type Ni3Al). These alloys enable return to solution of the $\gamma'$ phase by treatment at very high temperature. In practice there is a temperature gap of sufficient size between the completion of the dissolution of the $\gamma$ phase and the initiation of fusion of the alloy. This gap in the return to solution of the $\gamma$ (difference in temperature between the solvus and the solidus) which is provided in alloys in accordance with the invention is of the order of thirty degrees. The treatment is completed by the two tempering treatments enabling the reprecipitation of the $\gamma'$ phase in the desired form.

Rather than adjusting the parameters of the phases $\gamma$ and $\gamma'$ by a study of the influence of the elements taken individually, an assembly of compositions has been tested in order to define the synergistic behaviour of the assembly of elements controlling the hardening phase. The object was to find a family of compositions which could ensure a high fraction of (in excess of 60%) and a precise division between the phases $\gamma$ and $\gamma'$ of certain elements which influence in a critical manner the crystalline parameters of each of the phases. This step has led to a definition of the criteria connecting several constituent elements of the alloys which are in the end more important than the individual ranges of the composition and these criteria have proven justified by the high level of the results produced by the alloys which take these criteria into account, especially in relation to their creep resistance.

While for this reason a detailed justification of the ranges of composition intended for each element will be inadequate to take into account the synergistic effect of the overall composition, the attempt will nevertheless be made hereinafter to justify the principle selections and to provide practical embodiments, as given hereinafter.

DESCRIPTION OF THE PREFERRED EMBODIMENTS

The introduction of cobalt into alloys in accordance with the invention enables an increase in the solubility of hardening elements (W, Mo, Ta) into the alloys, which leads to an improved resistance to creep. The presence of cobalt enables good stability of the alloy at high temperature. It has been proved in similar alloys, but not containing cobalt that there will be precipitates such as $\alpha$W, $\alpha$Cr or $\beta$ while high temperature is maintained. An amount of cobalt in this alloy lies between 5 and 8%, preferably between 6 and 8%, which will avoid the disadvantages which have been indicated.

Figure 1:
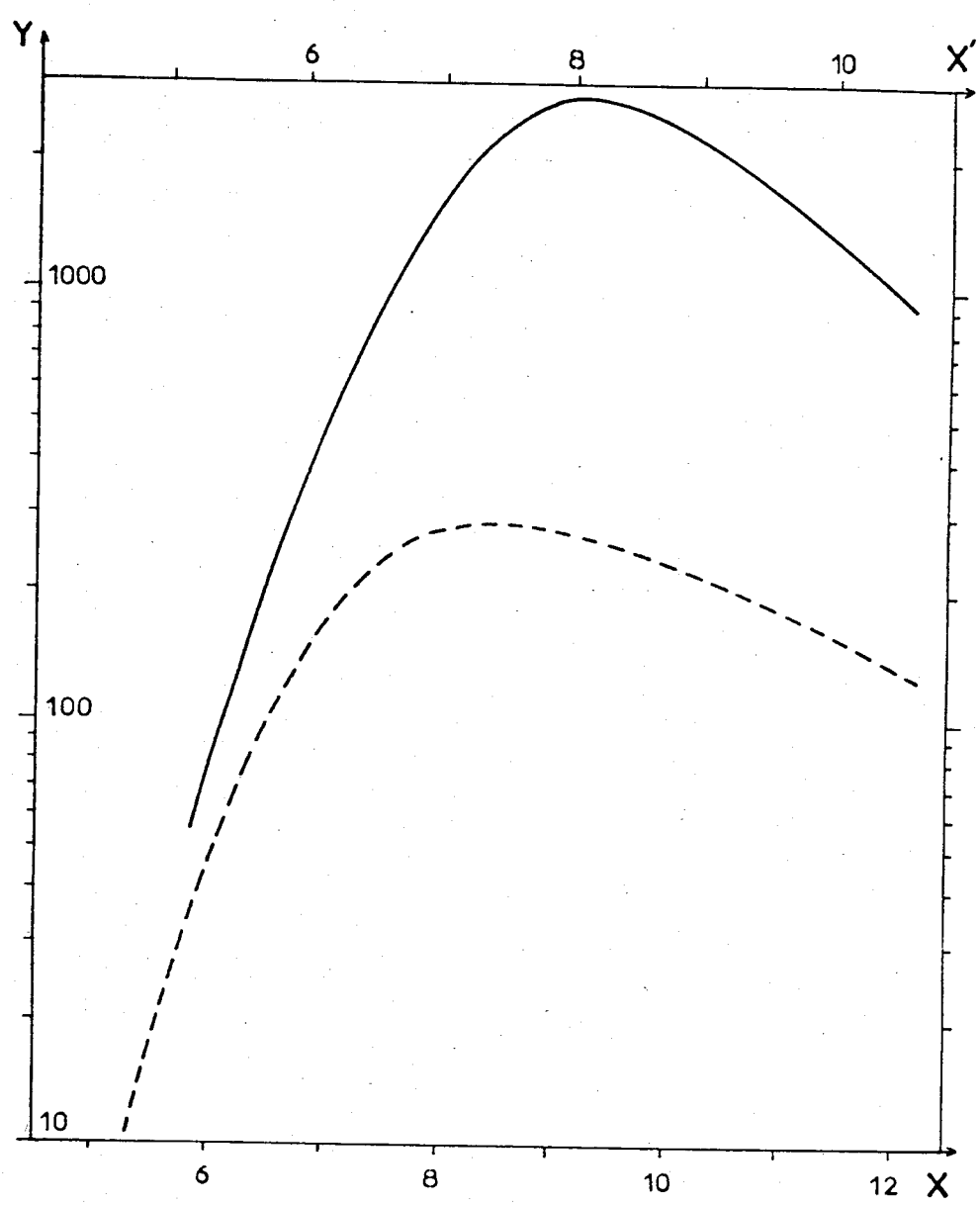
FIG. 1 is a graph enabling an understanding of the influence on the amount of chromium on the creep resistance of a monocrystalline alloy with a nickel base. The abscissae X and X' given respectively the atomic percentage and weight percentage by weight of chromium, while the ordinates Y indicate the time necessary, in hours, to give a 1% deformation of a test piece under the following conditions: 850° C. and 500 MPa for the curve in full line, 1050° C. and 120 MPa for the broken line curve.

The amount of chromium retained in the alloys should lie between 6.5 and 10% and preferably 6.5 and 8% in order to optimise the resistance to elongation creep of the alloy (see FIG. 1) at 850° C. and 1050° C. The curves of FIG. 1, which have been determined experimentally, show in practice that the strength at high temperature of the alloy increases when the amount of chrome increases but beyond an amount of about 10% by weight, the influence of chrome becomes harmful.

The elements molybdenum, tungsten and tantalum enable hardening of the alloy, that is to say to increase the creep resistance at all temperatures. A criterion such as the summation (% Ta+% Mo+½% W) enables enhancement of the hardness. It has been sought to keep the summation of the amounts of these elements as high as possible. It is, however, limited by the need to have an alloy with a density closer to 8.5 than to 9.0 and by the fact that with very large amounts of W, Mo or Ta the alloy will no longer be metallurgically stable for example because of the appearance of phases rich in Ta or W. Selection of the summation (% Ta+% Mo+½% W) within the range 11.5 to 13.5% by weight is recommended. This range has been determined experimentally.

With regard to the concentration of hardening elements defined hereinbefore, it is desirable to include a certain quantity of molybdenum (the amount lying between 0.5% and 2.5% and preferably between 1.0 and 2.5%) in order to improve the creep properties at high temperature (above 900° C.). The molybdenum confers an improved strength to the nickel matrix in which it segregates preferentially.

For similar considerations, tungsten is retained because of its contribution to the stability of the $\gamma$ phase. This element improves as a result the properties of the alloy but the amount remains limited by the risk of causing precipitation of the $\alpha W$ phase which is disadvantageous for the alloy, and because of this an amount lying between 5% and 9% and preferably between 5 and 8% is preferred.

The good qualities of the alloys studied are connected with the quantity of $\gamma'$ phase precipitated. There will be a higher proportion of this phase precipitated as the summation of the amounts of Al, Ti, Ta and Nb which are $\gamma'$ phase-generating elements increases. The value of this summation cannot be increased beyond a certain value otherwise solidification of the alloy will be affected. To a greater and greater extent the eutectic $\gamma/\gamma'$ will be formed on completion of solidification and passing into solution the $\gamma'$ phase by heat treatment will become inadequate. The range of variation in the summation Ti+Al+Ta+Nb as an atomic percentage is as follows: minimum value 15.5% and maximum value 17%. The atomic composition is maintained with a view to acting in such a way as to control the fraction of the phase $\gamma'$ Ni which forms and of which the composition is of the type Ni$_3$ (Ti, Al, Nb, Ta).

With regard to the $\gamma'$ composition of elements of the generating phase discussed hereinbefore, it is required that the composition of titanium should be at least 1% by weight (preferably at least 1.1%) and not exceeding 2%. It has been demonstrated in practice that in alloys where the titanium was replaced by aluminium, the resistance to creep between 750° and 1050° C. was reduced. As a result, titanium is introduced as a replacement for aluminium in order to increase the mechanical strength, particularly at high temperatures. Aluminium is thus maintained within the range by weight between 4.5 and 5.8% and preferably between 5 and 5.5%.

Tantalum on the one hand increases the volumetric fraction of $\gamma'$ and on the other hand hardens the alloy in general. It is thus desirable that the amount should be at least 6% by weight. In contrast, it must be limited to 9% and preferably to 8% in order not to increase unduly the density of the alloy.

Niobium in alloys in accordance with the invention increases the resistance to elongating creep at the lower temperatures 750° to 850° C. without adversely affecting the properties at high temperatures. An addition of niobium up to 1.5% by weight is desirable and preferably this amount is limited to 1%. In certain cases a minimum amount of 0.5% is provided.

The criterion relating to hardening elements which has been referred to hereinbefore is completed by a supplementary criterion which integrates the influence of niobium, in the form of a summation of atomic percentages (%Ta+%Nb+%Mo+½% W) within the range 4 to 5.5%.

The criterion relating to the summation of the amounts of $\gamma'$ generating elements is similarly completed by another supplementary criterion which pays particular attention to the influence of the lighter elements, in the form of the variation in the summation Ti+Al in atomic percentage within a range 12.8 to 14.5%.

Finally, the variation range of the summation, in atomic percentage, of all the elements concerned in the preceding criteria, namely Al+Ti+Nb+Ta+Mo+½W has been determined experimentally as lying between 17.5 and 19.0%.

By way of example, more particularly four alloys A, B, C and D of the family in accordance with the invention have been studied. Their composition is given in Table 1 hereinafter, where the amounts are expressed as percentages by weight except for the summation Al+Ti+Ta+Nb which is in atomic percentages.

Figure 2:
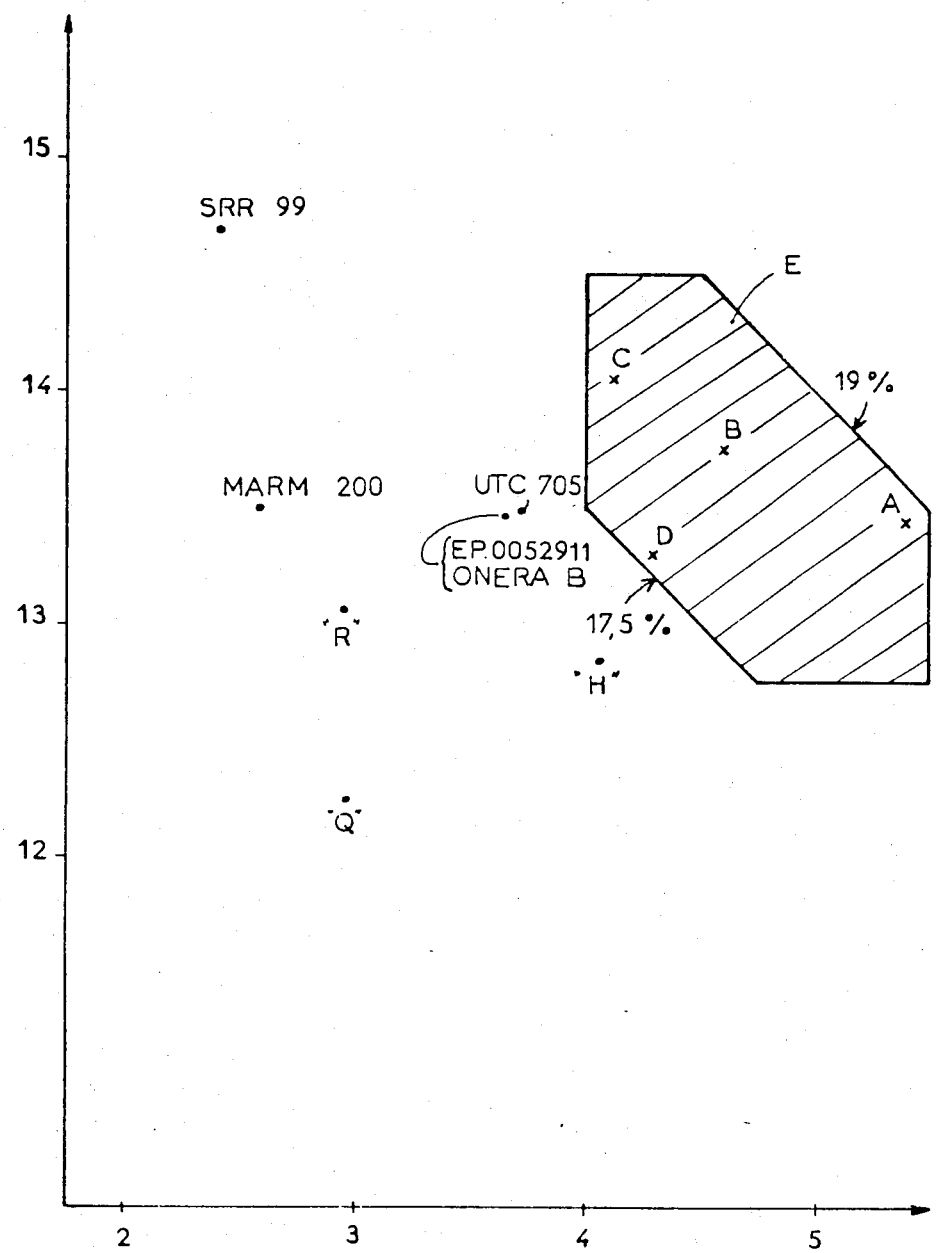
FIG. 2 is a graph having as abscissa the summation of the atomic percentages Ta+Mb+Mo+½W and as ordinate the summation of the atomic percentages Ti+Al and in which have been indicated the points corresponding to alloys in accordance with the invention and corresponding to known alloys, thus enabling the definition of a particular area of the plane in which alloys in accordance with the invention are appropriate.

In FIG. 2, a graphical representation has been shown of the three latter ranges which have been defined hereinbefore. In this graph, the alloys are represented by their amounts in atomic percentage of light elements Al+Ti which serve to generate $\gamma'$ phase shown as the abscissa and by their amounts in atomic percentage of elements influencing directly or indirectly the precipitation of the hardening phase Ta+Nb+Mo+½W, shown as the ordinate. The corresponding ranges determined experimentally define in this graph an area E represented by the cross-hatched zone. Within this area E which corresponds to alloys in accordance with the invention the corresponding points to the four alloys A, B, C and D of the family in accordance with the invention have been indicated and the corresponding values of the summations as atomic percentages which are given in Table 2. For comparison with alloys in accordance with the invention there have also been indicated on the graph of FIG. 2 the points corresponding to known alloys: SRR99 (developed by Rolls Royce), MAR M 200 an alloy in accordance with European Pat. No. EP-A 0052911, example B corresponding to French Pat. No. FR-A 2 503 188 in the name of ONERA, and the examples R, Q, H and 705 from French Pat. No. FR-A 2 512 837 in the name of United Technologies Corporation. All these known alloys lie outside of the area E defined for alloys in accordance with the invention. This situation is corroborated by the results obtained as will be apparent in greater detail hereinafter.

In alloys made up in the form of monocrystals, it is necessary to subject them to a sequence of heat treatments in order to optimize the properties. The aim of these treatments is to establish a homogeneous distribution of the precipitates of the γ' phase with a mean diameter of the order of 0.4 to 0.6 m. The applicants have shown the importance of a maximum size of γ' which must not be exceeded in order to avoid loss in creep resistance.

The thermal treatment commences by passing the γ' phase into solution, which must be as complete as possible. This is effected at a temperature slightly less than the initial fusion temperature. Typically, for the four alloys which has been referred to hereinbefore, this will take place at 1280° C. over a period of six hours for the alloys A and D, and 1310° C. over a period of four hours for the alloy B and at 1300° C. for a period of four hours for the alloy C. The solution treatment is followed by cooling at a rate sufficient to prevent the formation of γ' phase with a size exceeding 0.3 m. It is necessary that the cooling should take place at least with a velocity of the order of ten degrees per second throughout the specimen.

Two tempering treatments enable the precipitation of γ'. The first tempering is adjusted so as to obtain uniform distribution of γ', having a mean size of about 0.5 m. Several temperature/time combinations can fulfill this aim but especially at 1100° C. for 3 to 10 hours, up to 1050° C. for 10 to 24 hours, but the best treatment appears to be 1100° C. for five hours having regard to the fact that the form of the precipitate is less regular when the tempering temperature is higher and at a much lower temperature, the tempering time increases substantially. The second precipitating tempering treatment is effected up to about 850° C. over a period of 15 to 25 hours.

Figure 3:
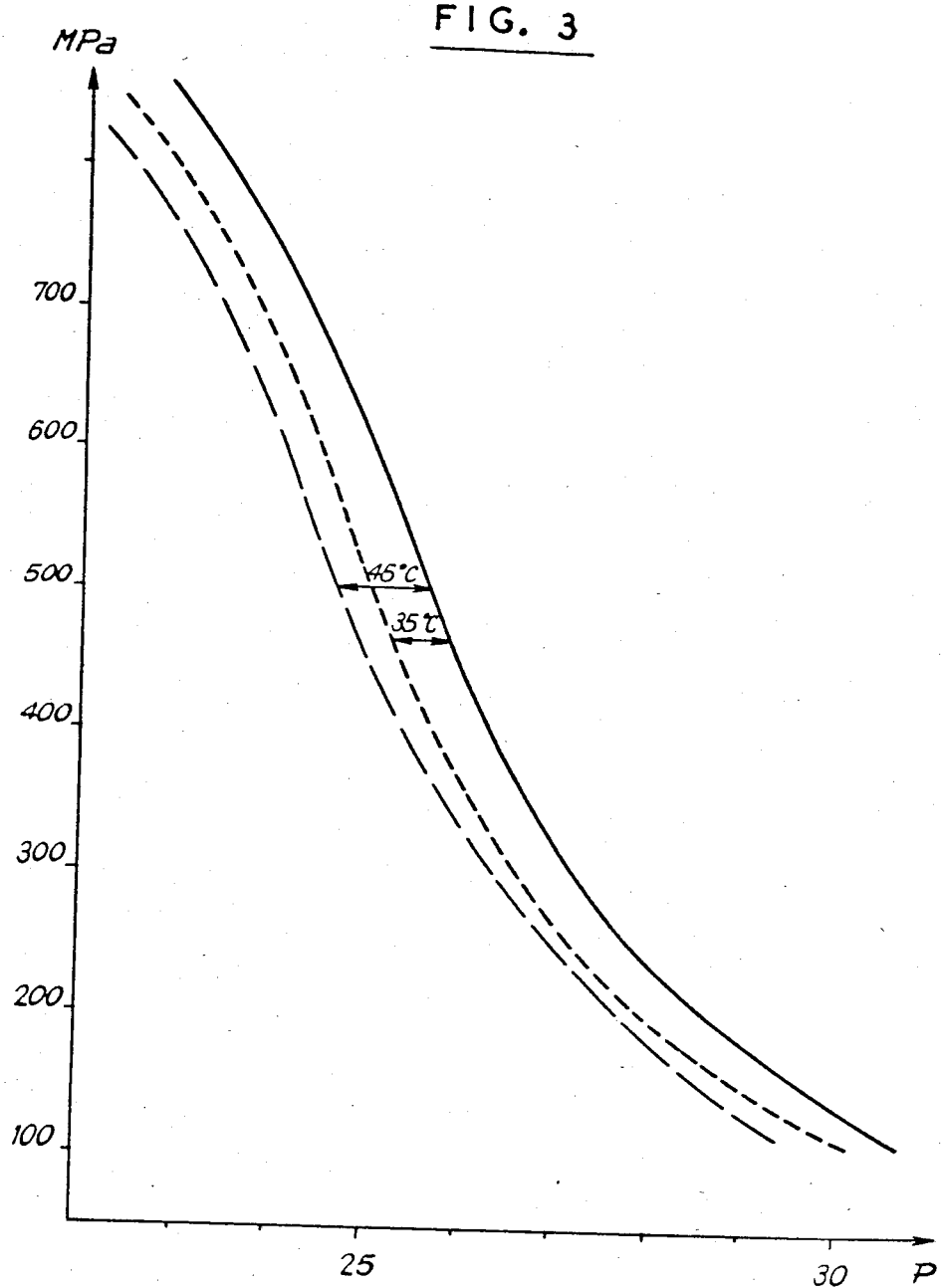
FIG. 3 is a Larson-Miller diagram illustrating the comparative results of creep tests. It gives the variation in the parameter $P = T(20 + \log t) \cdot 10^{-3}$ where T is the absolute temperature in °K, and t the time in hours as a function of the stress expressed in MPa. The curve in full line corresponds to an alloy in accordance with the invention while the curves respectively of short and long dashes correspond to known alloys.

The three alloys A, B and C have been tested for creep at 760° C., 950° C. and 1050° C. and the alloy D at 760° C. and 950° C. The results given in Table 3 hereinafter have been set out in FIG. 3 in the form of a Larson-Miller diagram in comparison with an alloy known under the name MARM 200 with a monocrystalline structure (curve in elongate dashes), and the alloy with a monocrystalline structure in accordance with European Pat. No. EP-A 0052911 (curve in short dashes, the material being developed by CANNON-MUSKEGON). The diagram makes fully clear the interesting features of alloys in accordance with the invention. An improvement of about 45° C. over MARM 200 and about 35° C. over the CANNON-MUSKEGON alloy.

TABLE 1

| Alloy | Ni | Co | Cr | Mo | W | Ta | Al | Ti | Nb | ½W + Ta + Mo | Al + Ti + Ta + Nb (% at) |
|---|---|---|---|---|---|---|---|---|---|---|---|
| A | base | 8 | 7 | 2 | 5 | 8 | 5 | 1,8 | 1 | 12,5 | 16,7 |
| B | base | 7,5 | 7 | 2 | 8 | 6 | 5,3 | 1,5 | — | 12 | 15,8 |
| C | base | 6,5 | 7,5 | 1,5 | 7 | 6,5 | 5,3 | 1,8 | — | 11,5 | 16,2 |
| D | base | 5 | 10 | 0,5 | 6 | 9 | 5,25 | 1,25 | — | 12,5 | 16,25 |

TABLE 2

| | SUMMATION IN ATOMIC PERCENTAGES | | |
|---|---|---|---|
| Alloy | Al + Ti | Nb + Ta + Mo + ½W | Al + Ti + Nb + Ta + Mo + ½W |
| A | 13,45 | 5,40 | 18,85 |
| B | 13,75 | 4,60 | 18,35 |
| C | 14,05 | 4,25 | 18,30 |
| D | 13,30 | 4,30 | 17,60 |

TABLE 3

| | CREEP CONDITIONS | | RESULTS | |
|---|---|---|---|---|
| Alloys | Temperature (°C.) | Stress (MPa) | Time required for 1% deformation (hours) | Time required for rupture (hours) |
| A | 760 | 750 | 202 | 857 |
| | 950 | 240 | 228 | 545 |
| | 1050 | 120 | 1004 | 1073 |
| | 1050 | 140 | 304 | 338 |
| B | 760 | 840 | 48 | 410 |
| | 950 | 240 | 247 | 603 |
| | 1050 | 140 | 430 | 496 |
| C | 760 | 750 | 330 | 1000 |
| | 950 | 240 | 194 | 480 |
| | 1050 | 140 | 365 | 435 |
| D | 760 | 750 | 151 | 732 |
| | 950 | 240 | 175 | 528 |
| EP-A 0052911 | 760 | 750 | 55 | 560 |
| | 950 | 240 | 100 | 253 |
| | 1050 | 120 | 320 | 460 |
| MAR M 200 | 760 | 750 | 10 | 250 |
| | 950 | 240 | 55 | 170 |
| | 1050 | 120 | 85 | 140 |

We claim:

1. Monocrystalline alloy with a nickel base matrix having a high creep resistance, having a density of the order of 8.6% and consisting essentially of the following composition:

| | | | |
|---|---|---|---|
| Co | 5 | to | 8% |
| Cr | 6.5 | to | 10% |
| Mo | 0.5 | to | 2.5% |
| W | 5 | to | 9% |
| Ta | 6 | to | 9% |
| Al | 4.5 | to | 5.8% |
| Ti | 1 | to | 2% |
| Nb | 0 | to | 1.5% |
| C,Zr,B | each less than 100 ppm | | |
| Ni | remainder to 100% | | | the percentages being given by weight, and the following criteria being observed:

the summation of the percentages by weight of Ta+Mo+½W lies between 11.5% and 13.5%;
the summation of Ti+Al+Ta+Nb in atomic percentages lies between 15.5 and 17%;
the summation of the atomic percentages of Ta+Nb+Mo+½W lies between 4 and 5.5%;
the summation of the atomic percentages Ti+Al+Ta+Nb+Mo+½W lies between 17.5 and 19%; and the summation of the atomic percentages Ti+Al lies between 12.8% and 14.5%.

2. Monocrystalline alloy with a high creep resistance having a matrix of nickel base, of a density of the order of 8.6 without intentional addition of carbon, boron or zirconium, the alloy having the following composition:

| Co | 6 to 8% |
| Cr | 6.5 to 8% |
| Mo | 1 to 2.5% |
| W | 5 to 8% |
| Ta | 6 to 8% |
| Al | 5 to 5.5% |
| Ti | 1.1 to 2% |
| Nb | 0 to 1% |
| Ni | balance to 100% | the percentages being expressed by weight and the following additional criteria being observed:
the summation of the percentages by weight of Ta+Mo+½W lies between 11.5% and 13.5%;
the summation Ti+Al+Ta+Nb in atomic percentages lies between 15.5 and 17%;
the summation of the atomic percentages Ta+Nb+Mo+½W lies between 4 and 5.5%;
the summation of the atomic percentages Ti+Al+Ta+Nb+Mo+½W lies between 17.5 and 19%; and
the summation of the atomic percentages Ti+Al lies between 12.8 and 14.5%.

3. An alloy according to claim 1, wherein it is subjected to a heat treatment at high temperature in order to pass into solution completely the gamma-prime phase followed by a quenching in order to precipitate the gamma-prime phase while preventing the formation of gamma-prime phase with a size in excess of 0.3 micron, which is completed by two heat treatments.

4. An alloy according to claim 2, wherein it is subjected to a heat treatment at high temperature in order to pass into solution completely the gamma-prime phase followed by a quenching in order to precipitate the gamma-prime phase while preventing the formation of gamma-prime phase with a size in excess of 0.3 micron, which is completed by two heat treatments.

5. An alloy according to claim 1, having the following composition:

| Co | 8% by weight |
| Cr | 7% by weight |
| Mo | 2% by weight |
| W | 5% by weight |
| Ta | 8% by weight |
| Al | 5% by weight |
| Ti | 1.8% by weight |
| Nb | 1% by weight | the remainder being nickel
½W+Ta+Mo: 12.5% by weight
Al+Ti+Ta+Nb: 16.7% in atomic percentage
Ta+Nb+Mo+½W: 5.4% in atomic percentage
Ti+Al+Ta+Nb+Mo+½W: 18.85% in atomic percentage
Ti+Al: 13.45% in atomic percentage.

6. An alloy according to claim 1, having the following composition:

| Co | 7.5% by weight |
| Cr | 7% by weight |
| Mo | 2% by weight |
| W | 8% by weight |
| Ta | 6% by weight |
| Al | 5.3% by weight |
| Ti | 1.5% by weight |
| Nb | 0% by weight | the remainder being nickel
½W+Ta+Mo: 12% by weight
Al+Ti+Ta+Nb: 15.8% in atomic percentage
Ta+Nb+Mo+½W: 4.6% in atomic percentage
Ti+Al+Ta+Nb+Mo+½W: 18.35% in atomic percentage
Ti+Al: 13.75% in atomic percentage.

7. An alloy according to claim 1, having the following composition:

| Co | 6.5% by weight |
| Cr | 7.5% by weight |
| Mo | 1.5% by weight |
| W | 7% by weight |
| Ta | 6.5% by weight |
| Al | 5.3% by weight |
| Ti | 1.8% by weight |
| Nb | 0% | the remainder being nickel, the following criteria also being observed
½W+Ta+Mo: 11.5% by weight
Al+Ti+Ta+Nb: 16.2% in atomic percentage
Ta+Nb+Mo+½W: 4.25% in atomic percentage
Ti+Al+Ta+Nb+Mo+½W: 18.30% in atomic percentage
Ti+Al: 14.05% in atomic percentage.

8. An alloy according to claim 1, having the following composition:

| Co | 5% by weight |
| Cr | 10% by weight |
| Mo | 0.5% by weight |
| W | 6% by weight |
| Ta | 9% by weight |
| Al | 5.25% by weight |
| Ti | 1.25% by weight |
| Nb | 0% | the remainder being nickel, the following criteria also being observed
½W+Ta+Mo: 12.5 by weight
Al+Ti+Ta+Nb: 16.25% in atomic percentage
Ta+Nb+Mo+½W: 4.3% in atomic percentage
Ti+Al+Ta+Nb+Mo+½W: 17.60% in atomic percentage
Ti+Al: 13.3% in atomic percentage.

9. An alloy according to claim 1, wherein the percentage by weight of Nb lies between 0.5 and 1.5%.

10. An alloy according to claim 3, wherein the alloy is subject to heat treatment at 1280° C. over a period of 6 hours in order to pass the gamma-prime phase completely into solution.

11. An alloy according to claim 3, wherein the heat treatment takes place at 1310° C. over a period of 4 hours in order to pass the gamma-prime phase completely in solution.

12. An alloy according to claim 3, wherein the heat treatment takes place at 1300° C. over a period of 4 hours in order to pass the gamma-prime phase into complete solution.

13. An alloy according to claim 3, wherein the first tempering treatment takes place at 1100° C. over a period of 3 to 10 hours.

14. An alloy according to claim 3, wherein the second tempering treatment takes place at 850° C. over a period of 15 to 25 hours.

* * * * *

UNITED STATES PATENT AND TRADEMARK OFFICE
CERTIFICATE OF CORRECTION

PATENT NO. : 4,639,280

DATED : January 27, 1987

INVENTOR(S) : Allan Fredholm, et al

It is certified that error appears in the above-identified patent and that said Letters Patent is hereby corrected as shown below:

Title page: [73]

The Assignee information is printed incorrectly.
Should read as follows:

- Association pour la Recherche et le Developpement des Methodes et Processus Industriels "A.R.M.I.N.E.S.", Paris; Societe Imphy S.A., Paris La Defense; Office National d'Etudes et de Recherches Aerospatiales (ONERA), Chatillon; Societe Nationale d'Etude et de Construction de Moteurs d'Aviation "S.N.E.C.M.A.", Paris, all of France Signed and Sealed this Twenty-third Day of February, 1988

Attest:

DONALD J. QUIGG

Attesting Officer

Commissioner of Patents and Trademarks